(12) United States Patent
Coots et al.

(10) Patent No.: US 11,044,841 B2
(45) Date of Patent: Jun. 22, 2021

(54) FEEDER SYSTEM, PICK AND PLACE MACHINE, AND METHOD

(71) Applicant: Universal Instruments Corporation, Conklin, NY (US)

(72) Inventors: Charles Andrew Coots, Binghamton, NY (US); Michael Joseph Kane, Binghamton, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 238 days.

(21) Appl. No.: 16/330,176

(22) PCT Filed: Sep. 13, 2017

(86) PCT No.: PCT/US2017/051299
§ 371 (c)(1),
(2) Date: Mar. 4, 2019

(87) PCT Pub. No.: WO2018/052956
PCT Pub. Date: Mar. 22, 2018

(65) Prior Publication Data
US 2019/0191607 A1 Jun. 20, 2019

Related U.S. Application Data

(60) Provisional application No. 62/393,902, filed on Sep. 13, 2016.

(51) Int. Cl.
*G06F 7/00* (2006.01)
*H05K 13/08* (2006.01)
(Continued)

(52) U.S. Cl.
CPC ......... *H05K 13/0812* (2018.08); *B65G 47/90* (2013.01); *B65H 37/002* (2013.01);
(Continued)

(58) Field of Classification Search
CPC ........... H05K 13/0812; H05K 13/0813; H05K 13/0419; H05K 13/0815; B65G 47/90; B65G 2201/02; B65H 37/002
(Continued)

(56) References Cited

U.S. PATENT DOCUMENTS 4,810,154 A 3/1989 Klemmer et al.
5,214,841 A 6/1993 Howard et al.
(Continued)

FOREIGN PATENT DOCUMENTS

CN 87101876 A 10/1987
CN 1592574 A 3/2005
(Continued)

OTHER PUBLICATIONS

Application No. PCT/US2017/051299, International Search Report and the Written Opinion of the International Searching Authority, or the Declaration dated Nov. 22, 2017, 15 pages.
(Continued)

*Primary Examiner* — Yolanda R Cumbess
(74) *Attorney, Agent, or Firm* — Schmeiser, Olsen & Watts, LLP (57) ABSTRACT

A feeder system includes a feeder configured to receive a component, a pick location configured to present the component from the carrier tape for a subsequent picking process, a camera system configured to view the component at or prior to the pick location. The camera system is configured to measure an offset between one or more topside features of the component and an outline of the component. A pick and place machine that includes the feeder, and a method of inspecting components.

19 Claims, 6 Drawing Sheets

(51) Int. Cl.
*H05K 13/04* (2006.01)
*B65G 47/90* (2006.01)
*B65H 37/00* (2006.01)

(52) U.S. Cl.
CPC ..... *H05K 13/0419* (2018.08); *H05K 13/0813* (2018.08); *H05K 13/0815* (2018.08); *B65G 2201/02* (2013.01)

(58) Field of Classification Search
USPC ................................. 700/213, 218, 228–229
See application file for complete search history.

(56) References Cited

U.S. PATENT DOCUMENTS

| | | | |
|---|---|---|---|
| 6,031,242 A | 2/2000 | Hudson | |
| 6,085,407 A | 7/2000 | Gamel et al. | |
| 6,463,653 B1 | 4/2002 | Rao et al. | |
| 6,467,158 B1 | 10/2002 | Kiyomura et al. | |
| 6,506,614 B1 | 1/2003 | Strassmann | |
| 6,634,159 B1 | 10/2003 | Muto et al. | |
| 6,801,652 B1 | 10/2004 | Stanzi et al. | |
| 6,902,090 B2 | 6/2005 | Yamamura et al. | |
| 7,246,429 B2 | 7/2007 | Oyama | |
| 7,506,434 B2 | 3/2009 | Sumi et al. | |
| 7,526,140 B2 | 4/2009 | Fang et al. | |
| 7,616,803 B2 | 11/2009 | Wakabayashi | |
| 7,802,957 B2 | 9/2010 | Yamamura et al. | |
| 8,381,395 B2 | 2/2013 | Bachthaler et al. | |
| 8,446,466 B2 | 5/2013 | Ikeda et al. | |
| 2002/0029468 A1* | 3/2002 | Koike | H05K 13/0413 29/832 |
| 2005/0235913 A1 | 10/2005 | Prentice et al. | |
| 2006/0075631 A1* | 4/2006 | Case | H05K 13/0812 29/709 |
| 2007/0120977 A1* | 5/2007 | Duquette | H04N 13/239 348/87 |
| 2009/0046921 A1 | 2/2009 | Case et al. | |
| 2010/0181361 A1 | 7/2010 | Tsukagoshi | |
| 2010/0295935 A1 | 11/2010 | Case et al. | |
| 2012/0066898 A1 | 3/2012 | Gustafsson et al. | |
| 2013/0057676 A1* | 3/2013 | Ikeda | H05K 13/0812 348/87 |
| 2015/0307288 A1* | 10/2015 | Sumi | B65G 47/917 29/407.04 |
| 2016/0205820 A1* | 7/2016 | Ohashi | H05K 13/0417 29/739 |

FOREIGN PATENT DOCUMENTS

| | | |
|---|---|---|
| CN | 1728936 A | 2/2006 |
| CN | 1980567 A | 6/2007 |
| CN | 101032200 A | 9/2007 |
| CN | 103596416 A | 2/2014 |
| CN | 104981105 A | 10/2015 |
| JP | S6317541 A | 1/1988 |
| JP | H09018195 A | 1/1997 |
| JP | H09294000 A | 11/1997 |
| JP | H1013088 A | 1/1998 |
| JP | H10256799 A | 9/1998 |
| JP | 2002353693 A | 12/2002 |
| JP | 2003168890 A | 6/2003 |
| JP | 2005302918 A | 10/2005 |
| JP | 2007287838 A | 11/2007 |
| JP | 2008516453 A | 5/2008 |
| JP | 2010050337 A | 3/2010 |
| JP | 2014110410 A | 6/2014 |
| WO | 2018052956 A1 | 3/2018 |

OTHER PUBLICATIONS

Office Action in corresponding Chinese Patent Application No. 2017800561898, dated Jun. 20, 2020. 3 pages.
Office Action in corresponding Japanese Patent Application No. 2019-513834 dated Feb. 16, 2021. 8 pages.
Office Action in corresponding Chinese Office Action dated Feb. 8, 2021. 4 pages.

* cited by examiner

FEEDER SYSTEM, PICK AND PLACE MACHINE, AND METHOD

CROSS-REFERENCE TO RELATED APPLICATIONS

This application claims priority to PCT Application No. PCT/US2017/51299, having a filing date of Sep. 13, 2017, entitled "Feeder System, Pick and Place Machine, and Method," which claims priority to U.S. Provisional Application No. 62/393,902, having a filing date of Sep. 13, 2016, entitled "High Speed High Accuracy Top Side Alignment Process," the entire contents of which are hereby incorporated by reference.

TECHNICAL FIELD

The subject matter disclosed herein relates generally to the inspection of components. More particularly, the subject matter relates to feeders, pick and place machines and methods to inspect component outlines during tape feeding of components.

BACKGROUND

Components in pick and place processes are often picked up from a feeder, placed on an inspection plate, imaged by a first imaging system, picked up from the inspection plate, imaged by a second imaging system, and finally placed. Limitations of this type of system include: reduced speed due to multiple picks and places of a component; reduced speed due to multiple imaging processes for the component; increased complexity due to multiple imaging stations; and increased risk of error due to multiple component handling steps.

Thus, an improved method and apparatus to alleviate or reduce one or more of the above limitations would be well received in the art.

BRIEF DESCRIPTION

According to a first embodiment, a feeder system comprises: a feeder configured to receive a component; a pick location configured to present the component from the carrier tape for a subsequent picking process; and a camera system configured to view the component at or prior to the pick location, wherein the camera system is configured to measure an offset between one or more topside features of the component and an outline of the component.

According to a second embodiment, a method of inspecting components comprises: receiving, by a feeder, a component; acquiring, by a camera system, position information related to the position of the component; presenting, after the acquiring, the component for picking; and picking the component with a pick and place head.

According to a third embodiment, a pick and place machine comprises: a feeder system including: a feeder configured to receive a component; and a pick location configured to present the component from a carrier tape for a subsequent picking process; a pick and place head configured to pick up the component from the feeder; and a camera system configured to view the component at or prior to the pick location, wherein the camera system is configured to measure offset between a topside feature of the component and an outline of the component.

BRIEF DESCRIPTION OF THE DRAWINGS

Some embodiments of this invention will be described in detail, with reference to the following figures, wherein like designations denote like members, wherein.

DETAILED DESCRIPTION

A detailed description of the hereinafter described embodiments of the disclosed apparatus and method are presented herein by way of exemplification and not limitation with reference to the Figures.

Figure 1:
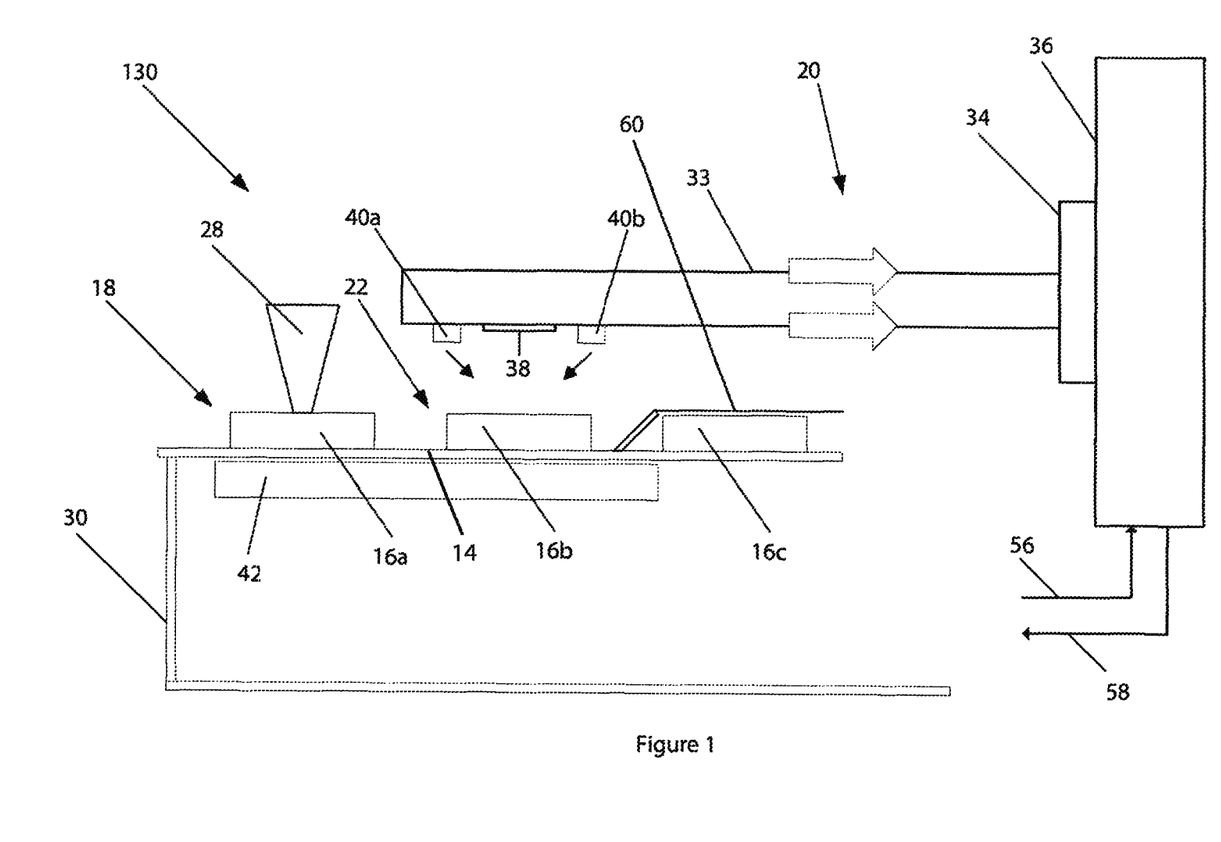
FIG. 1 depicts a side cutaway view of a feeder in accordance with one embodiment.
Figure 2:
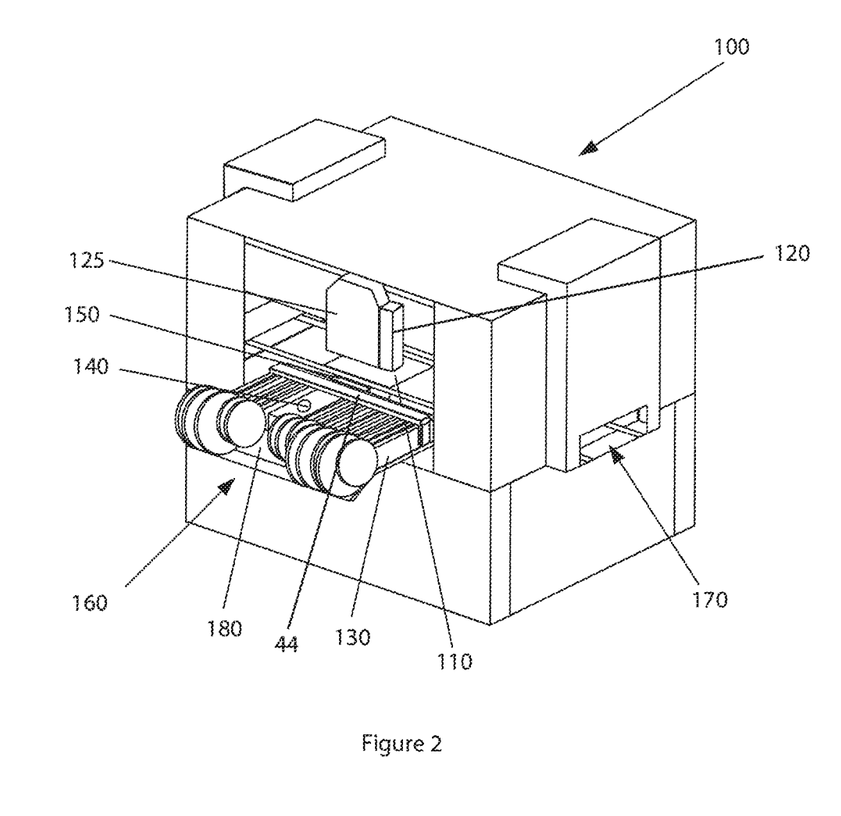
FIG. 2 depicts a pick and place machine having a feeder bank with the feeder of FIG. 1 in accordance with one embodiment.

Referring to FIG. 1, a side cutaway view of a feeder 130 is shown. As shown in FIG. 2, the feeder 130 may be mounted within a pick and place machine 100. The feeder 130 may be configured to receive a carrier tape 14 (shown in FIG. 5) having a plurality of components 16*a*, 16*b* (shown in FIG. 5) disposed thereon. The carrier tape 14 may be filled with many additional components; the components 16*a*, 16*b* shown are exemplary and various types of electronic components may be held in the feeder 130. The feeder 130 may include a pick zone 18 or pick location. The pick zone 18 may be a location where the plurality of components 16*a*, 16*b* from the carrier tape 14 are presented to a pick and place head 125 for a subsequent picking process. As shown, a nozzle 28 of the pick and place head 125 may be configured to pick up the plurality of components 16*a*, 16*b* after they arrive at the pick zone 18.

A camera system 20 may be configured to view the plurality of components at an inspection zone 22 while the components are still disposed in the carrier tape 14 and in the feeder 130. The camera system 20 may be pointed in a downward direction and may be located above the feeder 130. The inspection zone 22 may be located at or prior to the pick zone 18 in the path taken by the tape 14 to the pick zone 18. The camera system 20 may be configured to obtain, acquire and/or view position information related to the position of the components 16*a*, 16*b* relative to a topside feature 24 (shown in FIG. 5) of the carrier tape 14. The position information may be provided from the camera system 20 to a control system (not shown) of the pick and place machine 100. The control system may be operably connected to a pick and place head 125. The control system 20 and the pick and place head 125 may be configured to use or utilize this position information during picking and/or placement of the components 16*a*, 16*b*.

Referring to FIG. 2, the pick and place machine 100 is depicted. The pick and place machine 100 may comprise at least one feeder system 160. The feeder system 160 may include one or a plurality of the feeders 130 that may contain, or be loaded with, electronic components 16*a*, 16*b* that may ultimately be positioned on a printed circuit board such as the embodiment of a PCB 110. In addition, feeder system 160 may include one or more feeder banks 180 configured to receive the feeders 130. The electronic components 16a, 16b, feeders 130, feeder bank 180, various other elements and overall arrangement of the feeder system 160 may vary according to desired operability. For example, the components may vary in size and shape. Additionally, the number, size and shape of the feeders 130, may vary according to component size and board placement potential.

Furthermore, the embodiments of the pick and place machine 100 may include the pick and place head 125 having one or more nozzles 28 configured for holding the component 16a, 16b after being presented at the pick zone 18. The nozzle 28 may be configured to quickly pick, or select components from the feeders 130 of the feeder system 160. Moreover, pick and place head 125 may be configured to seize a picked component and move to place the component in a precise location on the PCB 110. In addition, the pick and place head 125 may be configured to pick and place a plurality of components on PCB 110 during a single pick and place sequence or multiple pick and place sequences. For example, the pick and place system may include a plurality of spindle devices or other mechanisms each having a nozzle, each nozzle each operable to pick and place electronic components.

Still further, embodiments of the pick and place machine 100 may be configured with one or more nozzle changer systems 150. The nozzle changer system 150 may store and manage additional nozzles that may be provided either for the replacement of a damaged or contaminated nozzle or for the exchange of one nozzle for another nozzle to accommodate various component holding needs.

The embodiments of a pick and place machine 100 may also include at least one PCB handling system 170 configured to transport the PCB 110 through the pick and place machine 100. Embodiments of the PCB handling system 170 may also include a transport belt (not shown) upon which the PCB 110 may ride while being transported through the pick and place machine 100. Moreover, embodiments of the PCB handling system 170 may also be configured to operate with the feeder system 160. The PCB 110 may transfer into, or enter the pick and place machine 100 via the PCB handling system 170, to a position within the pick and place machine 100, such as the approximate center of the pick and place machine 100, where a separate mechanism, such as a clamp or other fastening device, may secure the PCB 110 and hold it in position. The pick and place head 125 may then pick at least one electronic component 16a, 16b from at least one feeder 130 mounted on the feeder system 160 and place the component 16a, 16b onto the PCB 110. Once the pick and place process is complete the clamp or other fastening device, may release PCB 110, which then may transfer out of the pick and place machine 100 via the PCB handling system 170.

The pick and place machine 100 described herein is exemplary and the feeders 130 and the camera system 20 described herein may be applicable to various other embodiments of pick and place, dispensing, or assembly machines. Any machine that utilizes feeders 130 and/or feeder banks may incorporate embodiments of the camera system 20 described herein. For example, in other embodiments, the camera system 20 may be added to obtain, acquire and/or view a matrix tray (not shown) component providing device rather than the tape feeders 130.

In the exemplary embodiment shown in FIG. 1, the feeder 130 may include a main body 30 that may be configured to receive the carrier tape 14 having the components 16a, 16b disposed thereon. The carrier tape 14, and components 16a, 16b disposed thereon, may be configured to move through the feeder 130 to the inspection zone 22 and then ultimately to the pick zone 18 for a subsequent picking process.

The carrier tape 14 may include a cover 60 to protect each of the components prior to picking. This cover 60 may be a mylar cover, for example, and may be removed from the carrier tape 14 prior to the arrival by the component 16a, 16b, 16c at the inspection zone 22. Further, this removal of the cover 60 may be accomplished at a location that is prior to the pick zone 18. The removal of the cover 60 may provide for a more accurate inspection and may be accomplished by a cover removal component or mechanism (not shown) of the feeder 130.

Referring specifically to FIG. 1, the camera system 20 in this embodiment is shown having a fiberscope 33 that includes a lens 34, such as a c-mount lens, and a camera 36. The lens 34 is shown attached to the camera 36. The camera 36 may be a charge coupled device (CCD) camera in one embodiment. The camera 36 may be a smart camera and may include its own IP address and may be configured to communicate with the control system of the pick and place machine through a communication 58. Additionally, the camera 36 may be configured to communicate with the feeder 130. The camera 36 may be provided with feeder index information from either the control system of the pick and place machine 100 or the control system of the feeder 130 through a communication 56. The fiberscope 33 may include one or more fiber cables 38 extending from the camera 36 to the inspection zone 22. This may allow the camera 36 to be placed at a remote location relative to the inspection zone 22.

Further, the fiberscope 33 may include one or more lights 40a, 40b pointed at the inspection zone 22. The one or more lights 40a, 40b may be blue to provide for phosphor absorption. The inspection zone 22 may further be lit by an upward facing back light 42 situated under the carrier tape 14. The upward facing back light 42 may be a low-profile discreet LED strip or a thin light module that includes a flat emitter, for example. The upward facing back light 42 may be attached to the main body 30 of the feeder 130. In one embodiment, the upward facing light 42 may be attached at a tape deck of the feeder 130. Other embodiments are contemplated to light up the components 16a, 16b during the obtaining or acquiring, by the downward camera system 20, the position information at the inspection zone 22. No back lighting may be necessary in some embodiments. The lights 40a, 40b may not be required in other embodiments.

Figure 3:
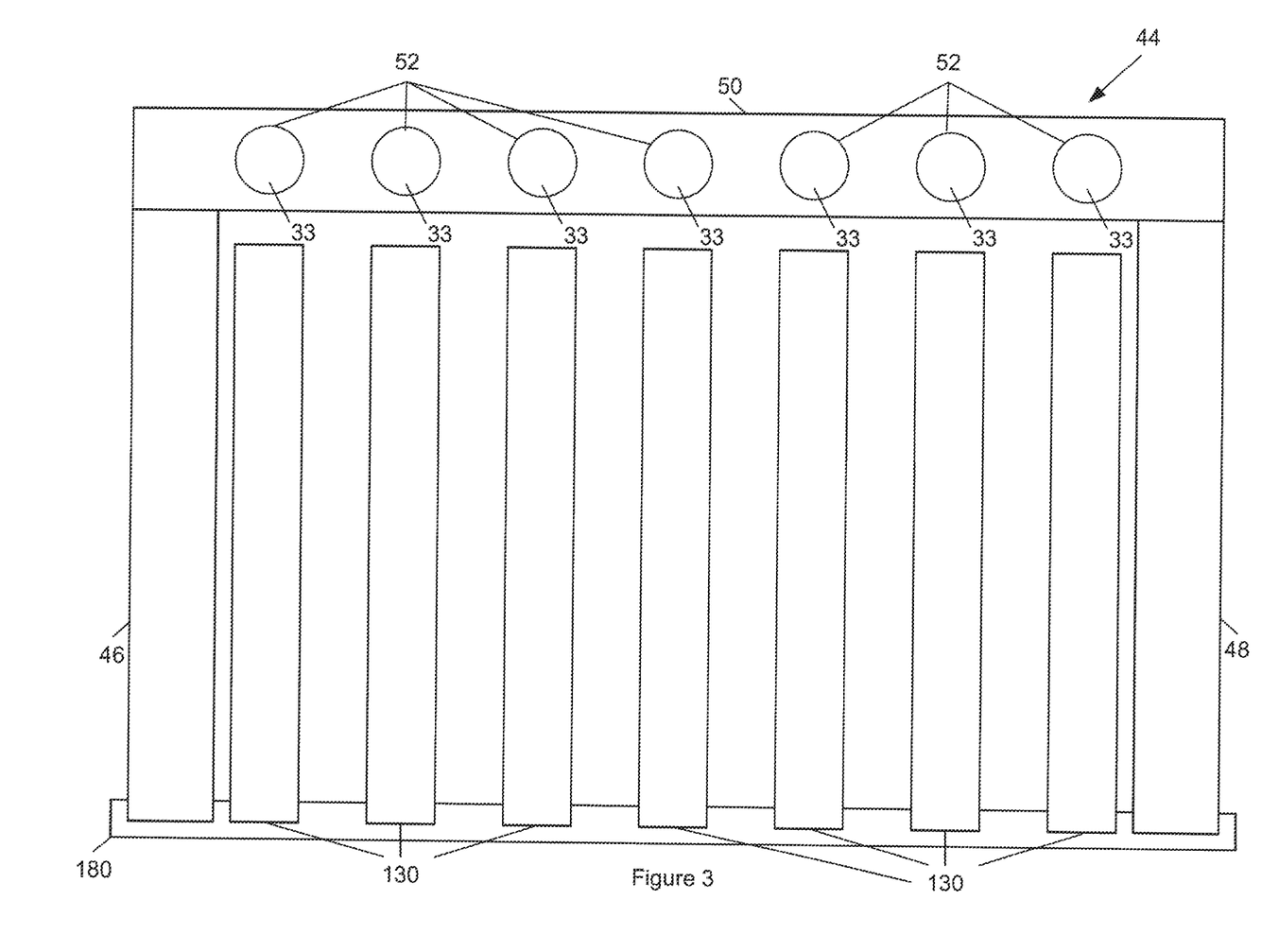
FIG. 3 depicts a side cutaway view of the feeder bank of FIG. 2 in accordance with one embodiment.
Figure 4:
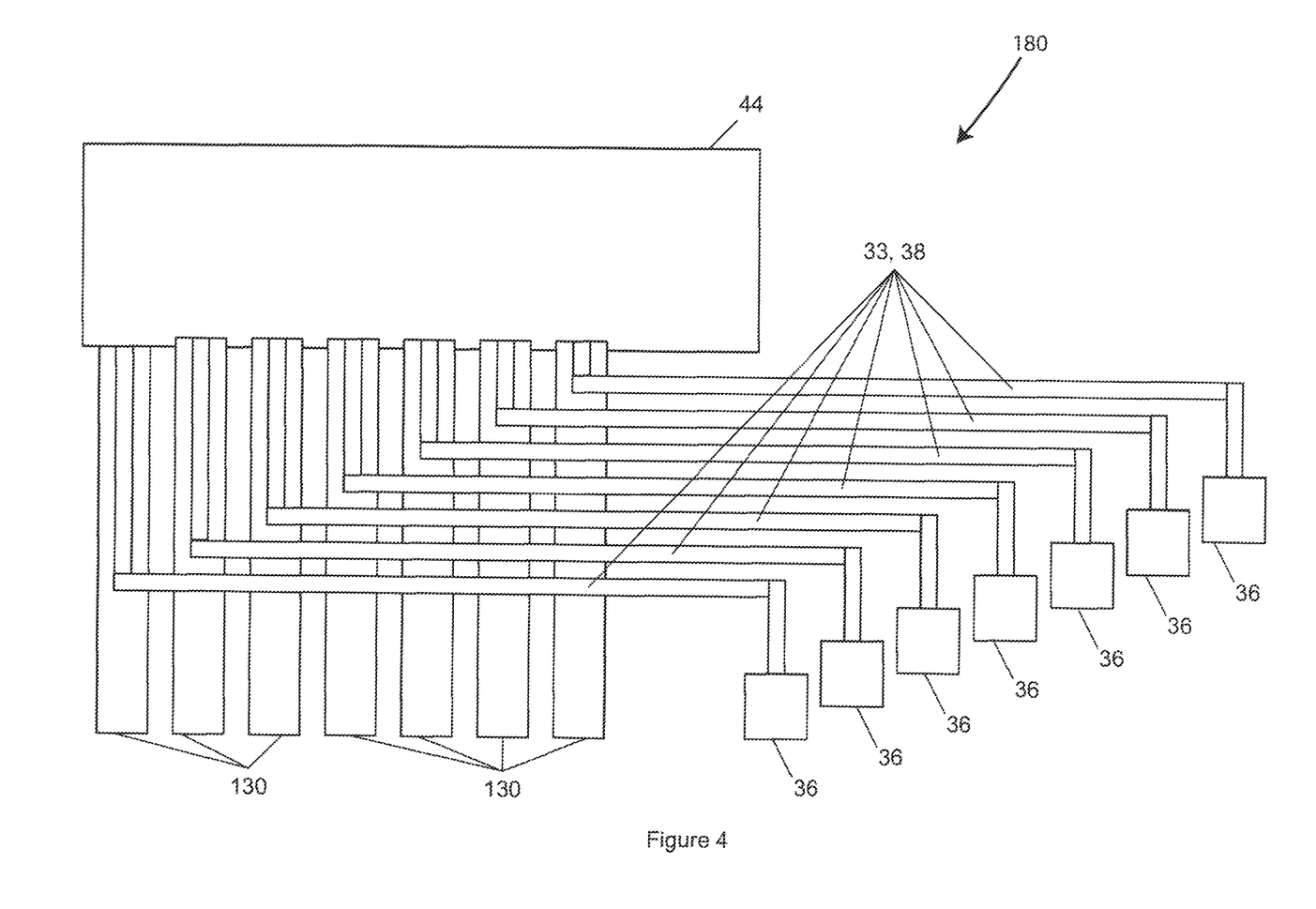
FIG. 4 depicts a top view of the feeder bank of FIGS. 2-3 in accordance with one embodiment.

Referring now to FIG. 3, a side cutaway view of the feeder bank 180 is shown having a plurality of the feeders 130 attached. A bridge 44 may be attached to the feeder bank 180. The bridge 44 may be a rigid structure that may be configured to support the downward camera system 20, including the fiberscope 33, fiber cables 38 and lights 40a, 40b for each respective feeder 130. The bridge 44 may also be configured to support and retain the camera 36 and the lens 34. In some embodiments, the camera 36 and the lens 34 may be located remotely from the bridge at another location in the pick and place machine 100. In this embodiment, the fiber cables 38 may run from the remote camera 36 and the lens 34 to the bridge 44. The bridge 44 may include a left side 46 extending up from the feeder bank 180, a right side 48 extending up from the feeder bank 180, and a top 50 extending between the left side 46 and the right side 48. Thus, the bridge 44 may extend above the feeders 130, as shown in FIG. 4. The bridge 44 may include a plurality of openings 52 that extend along the length of the feeders 130 into the bridge 44. The plurality of openings 52 may be configured to receive the fiber cables 38 of the fiberscope 33 for each camera 36 of the camera system 20. The openings 52 may be fashioned such that the fiber cables 38 are attachable or securable within the openings 52 so that the fiber cables are properly pointed at the inspection zone 22 of the feeder 130. A plurality of downward facing openings (not shown) may be located in the bridge 44 within each of the openings 52. Each downward facing opening may be located above each corresponding feeder 30 to allow the fiberscope 33 of the downward camera system 20 to view the inspection zone 22 at the feeders 130.

Referring to FIG. 4, a top view of the feeder bank 180 is shown with the bridge 44. The bridge 44 includes a plurality of fiber cables 38 each coupled to a charge coupled device (CCD) camera 36 to form a CCD array that may be situated adjacent the feeder bank 180 area. In this embodiment, the feeders 130 may each be situated in the feeder bank 180 under the bridge 44. The feeders 130 may each be mounted into the feeder bank 180 and dismounted from the feeder bank 180 without disturbing the downward camera system 20 or any of the components or features thereof.

While the bridge 44 is shown in order to structurally hold the camera system 20 components above the respective feeders 130, other embodiments for holding the camera system above the feeders 130 are contemplated. For example, the camera system 20 may not include remote cameras 36 attached through fiber cables 38 but may instead simply include one or more cameras attached to and situated directly above the feeder 130.

In another embodiment, one or more movable cameras 120 may be provided that move above the feeders 130. For example, a moveable downward looking camera that is attached to the pick and place head 125 is shown in FIG. 2. Any camera system is contemplated that is capable of viewing, obtaining and/or acquiring vision information pertaining to the location of the components 16a, 16b, etc. with respect to the feeder 130 and/or carrier tape 14. Further, the camera system may be configured to allow for the feeders 130 to be inserted and removed from feeder banks without removing or alternating the camera system 20.

Figure 5:
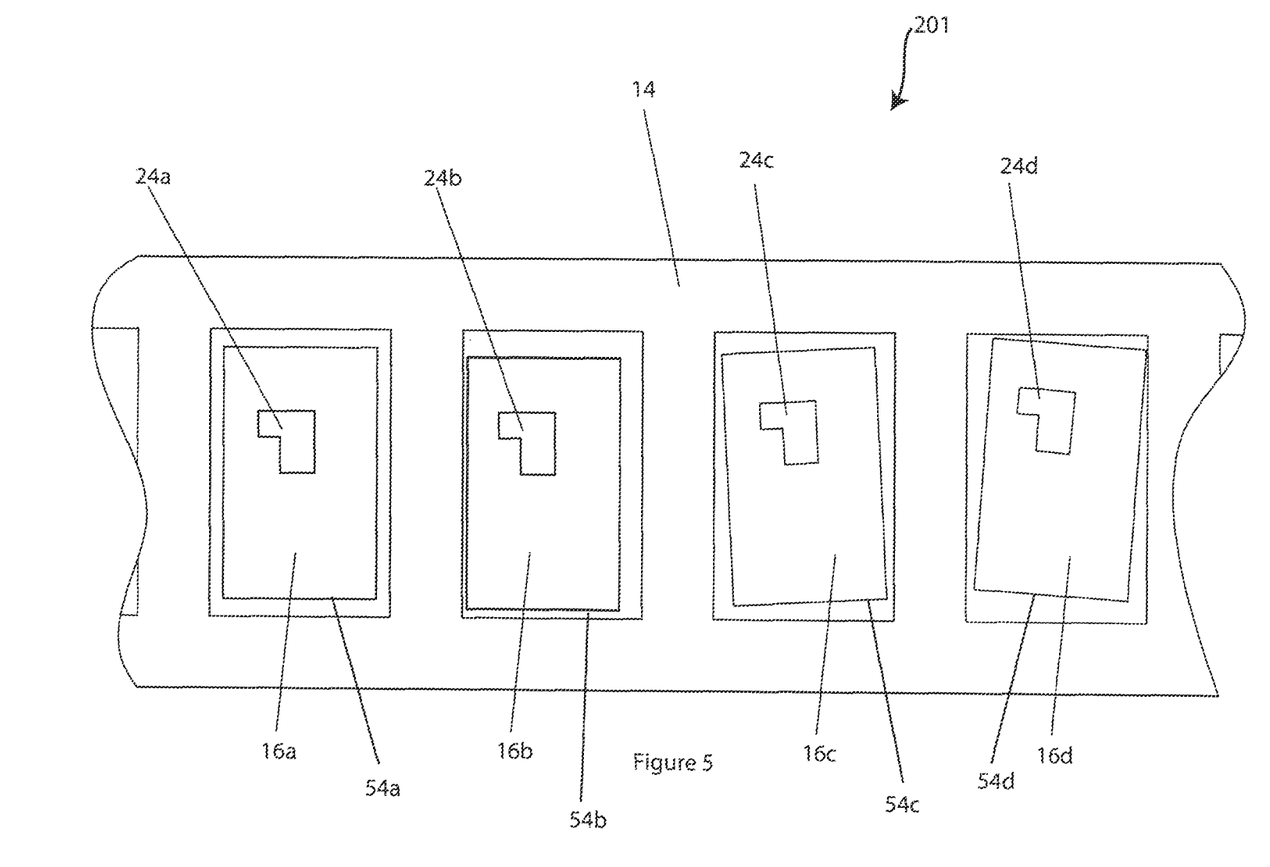
FIG. 5 depicts an image of components located in tape found in the feeder of FIG. 1 in accordance with one embodiment.

Referring to FIG. 5, an image 201 of components 16a, 16b, 16c, 16d located in the carrier tape 14 found in the feeder 130. The components 16a, 16b, 16c, 16d may each include at least one identifying topside feature 24a, 24b, 24c, 24d, respectively. The components 16a, 16b, 16c, 16d may also each include the outline 54a, 54b, 54c, 54d, respectively. The components 16a, 16b, 16c, 16d may include additional topside features than those shown. The camera system 20 may be configured to obtain position information so that a determination can be made of the offset between the outlines 54a, 54b, 54c, 54d of the component 16a, 16b, 16c, 16d, and the topside feature 24a, 24b, 24c, 24d of each component in the carrier tape 14. This may be accomplished by acquiring, obtaining and/or viewing an image of the topside features 24a, 24b, 24c, 24d of the component 16a, 16b, 16c, 16d and comparing the location of the topside feature 24a, 24b, 24c, 24d to the location of the component outline 54a, 54b, 54c, 54d in order to determine the offset of the component 16a, 16b, 16c, 16d from, for example, its expected position. This may allow the camera system 20 to acquire the position of each component 16a, 16b, 16c, 16d on the carrier tape 14.

The position information acquired by the camera system 20 at the feeders 130 prior to picking of the components 16a, 16b, 16c, 16d, etc. by the pick and place head 125 may be used by the control system of the pick and place machine 100 in order to facilitate the accurate picking and/or placement of the component 16a, 16b, 16c, 16d, etc. by the pick and place head 125. For example, once the position information is acquired by the camera system 20, this information may be utilized in order to allow the pick and place head 125 to more accurately pick up the component from the feeder 130. Additionally, the position information acquired by the camera system 20 may be utilized in order to better understand the position of the components 16a, 16b, 16c, 16d, etc. on the nozzle 28 and thereby achieve a more accurate placement of the components 16a, 16b, 16c, 16d, etc. on the PCB 110. This camera system 20 may obviate the need of performing an additional pick and place step at an inspection plate (not shown) prior to final placement.

Referring back to FIG. 2, in order to aid the picking and placing of components, embodiments of a PCB assembly machine 10 may further include a second camera system 140. The second camera system 140 may comprise an upward looking camera, which may image an electronic component prior to its placement on to PCB 90. From the obtained image, the control system of the pick and place machine 100 may determine whether or not the electronic component is place-able or not and the relationship of the component to the pick and placement system 125. Additionally, the second camera system 140 may help facilitate accurate placement of an electronic component on to a PCB.

Figure 6:
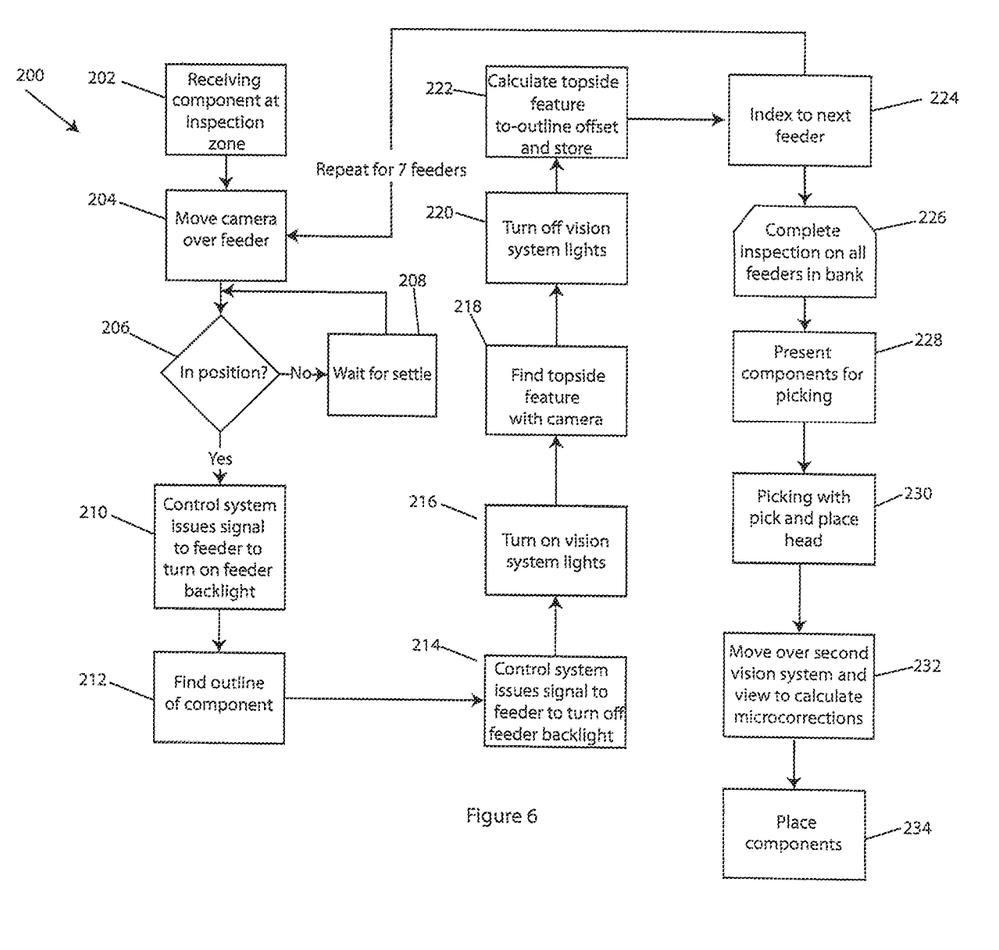
FIG. 6 depicts a process flow chart of a method of inspecting components in accordance with one embodiment.

Referring to FIG. 6, a process flowchart of a method of inspecting components 200 in a pick and place machine, such as the pick and place machine 100, is shown. The method 200 may include a first step 202 of receiving by a feeder, such as the feeder 130, a component, such as components 16a, 16b, 16c, 16d, at an inspection zone, such as the inspection zone 22.

The method 200 may include a step 204 of moving or positioning at least one camera, such as the camera 36, over the feeder, at the inspection zone, for example. The method 200 may include a step 206 of determining, by a control system, whether the camera is in position. If the camera is not in position, the method 200 may include a step 208 of waiting for the camera to move into position or waiting for the camera to settle into position. When the camera is in position, the method may proceed to the next step. It should be understood that steps 204, 206, 208 of the method 200 may be necessary in the event that the camera system is a moving camera system, such as the camera system 120. However, steps 204, 206, 208 may not be necessary in the event that the camera system is a stationary camera system situated over each of the feeders, such as the camera system 20.

The method 200 may then include a step 210 of issuing, sending and/or communicating a signal, by the control system of the pick and place machine, to the feeder to turn on an upward facing back light, such as the upward facing back light 42, that is situated behind the carrier tape on the feeder.

The method 200 may then include acquiring, by a camera system such as the camera system 20, position information relative to the position of one of the components on the carrier tape in the feeder. This acquiring step may first be accomplished, for example, by a step 212 of finding an outline, such as the outlines 54a, 54b, 54c, 54d, of the component with the camera. This may occur when the upward facing back light 42 is lit. Next, the method 200 may include a step 214 of issuing, sending and/or communicating a signal to the feeder to turn off the upward facing back light. The method 200 may include a next step 216 of issuing, sending and/or communicating a signal, by the control system of the pick and place machine, to turn on at least one light of the camera system, such as the lights 40a, 40b. The method 200 may then include a step 218 of finding, acquiring and/or obtaining a topside feature, such as the topside features 24a, 24b, 24c, 24d, of the component with the camera of the camera system.

The method 200 may then include a step 220 of turning off the camera system lights. This step 220 may be accomplished by sending a signal by the control system of the pick and place machine, for example. The method 200 may then include a step 222 of calculating, by the control system or a processor of the pick and place machine, the offset between the topside features of the component and an outline of the component and storing this information in a memory location of the control system. The method 200 may thus include determining, by a control system using the position information, a position of the component on the carrier tape. The method 200 may include providing the position of the component to a placement system, such as the pick and place head 125.

The method 200 may then include a step 224 of indexing to additional feeders in the case that a feeder bank, such as the feeder bank 180, includes a plurality of feeders. The method 200 may then repeat some or all of steps 202-222 on each additional feeder as necessary. The method 200 may include a step 226 of completing the inspection of all feeders in the feeder bank. Next, the method 200 may include a step 228 of presenting the components for picking by the pick and place head. Once the components in each feeder have been inspected, the method 200 may include a step 230 of picking, by the pick and place head, the components that have been inspected in accordance with the method 200. The method 200 may further include a step 232 of moving the pick and place head over a second camera system, such as the second camera system 140, to view the components on the pick and place head. The method 200 may include making micro-corrections and/or corrections to the movements of the pick and place head based on the information obtained by the camera systems. After corrections have been made, the method 200 may include a step 234 of placing the components on, for example, a PCB such as the PCB 110. Thus, the method 200 may include the pick and placement head(s) using the position information of the component obtained by the first camera system during picking and/or placement of the component by the pick and place head 125.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A feeder system comprising:
a feeder configured to receive a component;
a pick location configured to present the component from a carrier tape for a subsequent picking process; and
a camera system configured to view the component at or prior to the pick location prior to the subsequent picking process,
wherein the camera system is configured to measure an offset between one or more topside features of the component and an outline of the component.

2. The feeder system of claim 1, wherein the feeder is configured to receive the carrier tape, wherein the carrier tape includes a cover over the component, and wherein the feeder is configured to remove the cover prior to providing the component for viewing by the camera system.

3. The feeder system of claim 1, further comprising a feeder bank having a bridge, wherein the feeder is attached to the feeder bank, wherein the bridge extends across the feeder bank above the feeder, and wherein the camera system is located on the bridge.

4. The feeder system of claim 1, wherein the camera system includes a remote camera with a fiber optic lens.

5. The feeder system of claim 1, wherein the feeder further includes an upward facing back light under the carrier tape, and wherein the upward facing back light is a low-profile discreet LED strip.

6. The feeder system of claim 1, wherein the feeder is configured to receive a carrier tape having a cover over the component and wherein the feeder is configured to remove the cover prior to providing the component for viewing by the camera system.

7. A method of inspecting components comprising:
receiving, by a feeder, a component;
acquiring, by a camera system, position information related to the position of the component;
calculating an offset, by a control system, between an outline of the component and a topside feature of the component;
presenting, after the acquiring, the component for picking;
picking the component with a pick and place head.

8. The method of claim 7, wherein the receiving the component includes receiving a carrier tape having a cover over the component, the method further comprising removing the cover prior to the acquiring.

9. The method of claim 7, further comprising using the position information during the placement of the component by the pick and place head.

10. The method of claim 7, wherein the acquiring position information further includes finding the outline of the component and further includes finding the topside feature of the component.

11. The method of claim 10, further comprising:
signaling, by a control system, for the feeder to turn on an upward facing backlight located under the carrier tape prior to the finding the outline of the component; and
signaling, by a control system, for the camera system to turn on camera system lights prior to the finding the topside feature of the component.

12. A pick and place machine comprising:
a feeder system including:
a feeder configured to receive a component; and
a pick location configured to present the component from a carrier tape for a subsequent picking process;
a pick and place head configured to pick up the component from the feeder; and a camera system configured to view the component at or prior to the pick location prior to the subsequent picking process, wherein the camera system is configured to measure offset between a topside feature of the component and an outline of the component.

13. The pick and place machine of claim 12, further comprising a control system, and wherein the offset measurement from the camera system is provided to the control system.

14. The pick and place machine of claim 12, wherein the feeder system further includes a feeder bank having a bridge, wherein the feeder is attached to the feeder bank, wherein the bridge extends across the feeder bank above the feeder, and wherein the camera system is located on the bridge.

15. The pick and place machine of claim 12, wherein the camera system is attached to the feeder.

16. The pick and place machine of claim 12, wherein the camera system includes a remote camera with a fiber optic lens.

17. The pick and place machine of claim 12, wherein the feeder further includes an upward facing back light located under the carrier tape, and wherein the upward facing back light is a low-profile discreet LED strip.

18. The pick and place machine of claim 12, wherein the feeder system further includes a feeder bank, wherein the feeder is attachable to the feeder bank without disturbing the camera system.

19. The pick and place machine of claim 17, further comprising a control system, the control system configured to control the feeder, the pick and place head, the camera system, and the upward facing back light.

* * * * *